US012610768B2

(12) United States Patent
Kim et al.

(10) Patent No.: US 12,610,768 B2
(45) Date of Patent: Apr. 21, 2026

(54) METHOD OF PROCESSING A SUBSTRATE

(71) Applicant: Samsung Electronics Co., Ltd.,
Suwon-si (KR)

(72) Inventors: Junsang Kim, Suwon-si (KR); Yunha Kim, Suwon-si (KR); Hyeonjun Yun, Suwon-si (KR); Kwanghyun Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 243 days.

(21) Appl. No.: 18/608,163

(22) Filed: Mar. 18, 2024

(65) Prior Publication Data

US 2025/0096001 A1      Mar. 20, 2025

(30) Foreign Application Priority Data

Sep. 18, 2023      (KR) ........................ 10-2023-0123990

(51) Int. Cl.
H10P 52/40          (2026.01)
H10P 72/00          (2026.01)
H10P 72/76          (2026.01)

(52) U.S. Cl.
CPC ........ H10P 52/402 (2026.01); H10P 72/0428 (2026.01); H10P 72/7618 (2026.01)

(58) Field of Classification Search
CPC . H10P 72/0428; H10P 72/7616; H10P 52/402
See application file for complete search history.

(56) References Cited

U.S. PATENT DOCUMENTS

| | | | |
|---|---|---|---|
| 6,108,091 A | 8/2000 | Pecen et al. | |
| 6,293,845 B1 | 9/2001 | Clark-Phelps | |
| 6,564,116 B2 | 5/2003 | Wang et al. | |
| 7,050,880 B2 | 5/2006 | Roover et al. | |
| 7,115,017 B1 | 10/2006 | Laursen et al. | |
| 9,490,186 B2 | 11/2016 | Benvegnu et al. | |
| 11,883,922 B2 * | 1/2024 | Watanabe ............. | B24B 37/005 |
| 2015/0147829 A1 * | 5/2015 | Benvegnu ............... | B24B 49/04 |
| | | | 451/5 |

(Continued)

OTHER PUBLICATIONS

Noh, Kyungyoon et al. "Mechanics, mechanisms, and modeling of the chemical mechanical polishing process." (2001).

*Primary Examiner* — Binh X Tran
(74) *Attorney, Agent, or Firm* — Muir Patent Law, PLLC

(57) ABSTRACT

A method of processing a substrate includes disposing a substrate in a substrate processing apparatus and polishing the substrate. The substrate processing apparatus includes a polishing head and a polishing part. The polishing head includes a polishing head body. The polishing head body includes a pressure member including a first zone and a second zone. The substrate includes a first substrate zone located under the first zone and a second substrate zone located under the second zone. The polishing of the substrate includes rotating the substrate while applying a (1,1)-th pressure to the first substrate zone and applying a (2,1)-th pressure to the second substrate zone, calculating a (1,1)-th polishing rate of the first substrate zone and a (2,1)-th polishing rate of the second substrate zone, determining a reference polishing rate, and resetting a pressure applied to the first substrate zone to a (1,2)-th pressure.

20 Claims, 10 Drawing Sheets

(56) References Cited

U.S. PATENT DOCUMENTS

| | | | |
|---|---|---|---|
| 2015/0266159 A1* | 9/2015 | Shiokawa | B24B 49/04 |
| | | | 451/5 |
| 2020/0210547 A1* | 7/2020 | Dhandapani | B24B 49/10 |
| 2021/0379724 A1* | 12/2021 | Xu | B24B 37/013 |
| 2022/0283554 A1* | 9/2022 | Lau | B24B 49/12 |
| 2023/0043639 A1 | 2/2023 | Suzuki et al. | |

* cited by examiner

FIG. 6

$$\boxed{\text{Polishing amount of each of zones}} = \int_{t0}^{t} K_n * V_{n,t} * P_{n,t}\, dt$$

FIG. 7

$$\boxed{\text{Polishing rate of each of zones}} = \frac{1}{t - t_0} \int_{t0}^{t} K_n * V_{n,t} * P_{n,t}\, dt$$

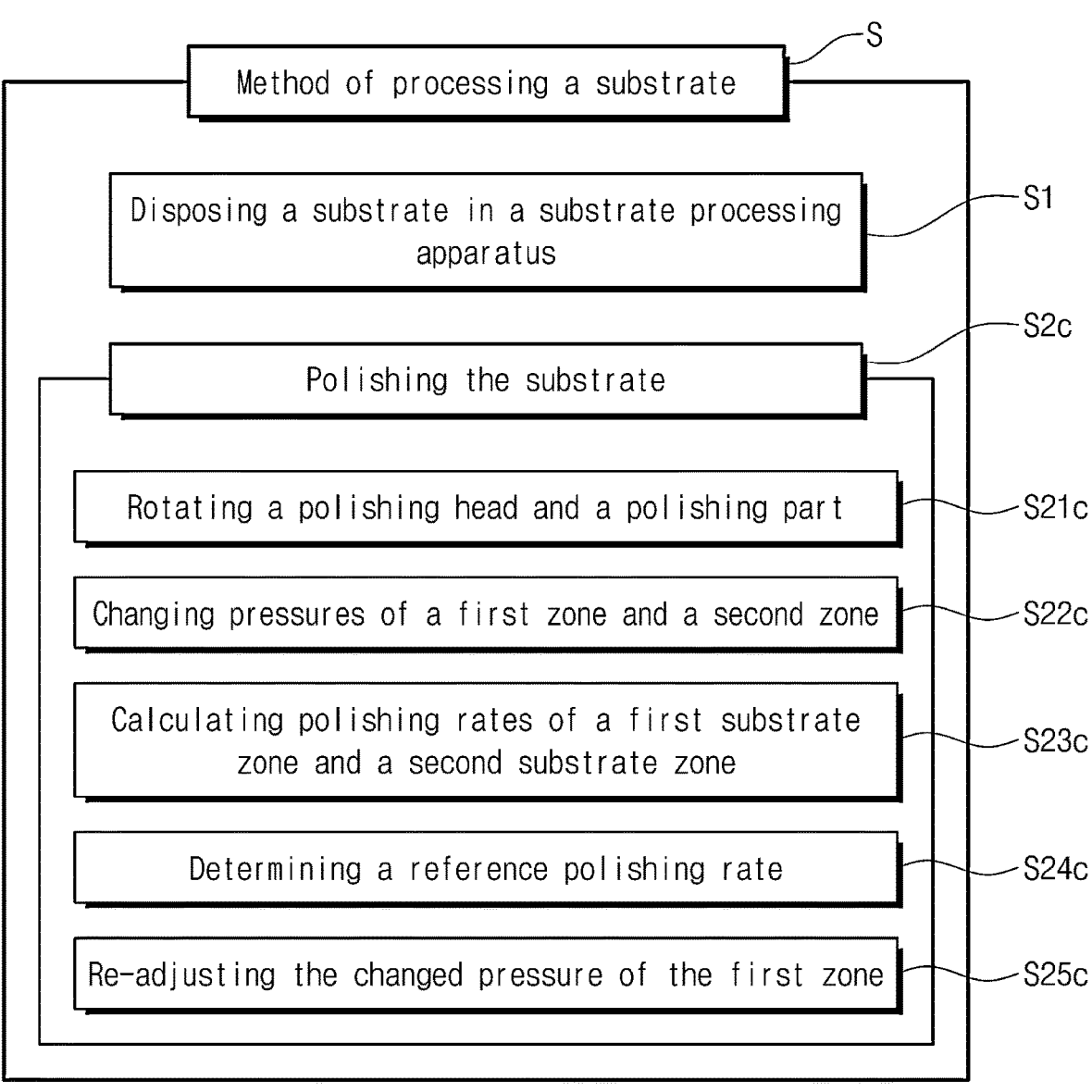

Method of processing a substrate — S

Disposing a substrate in a substrate processing apparatus — S1

Polishing the substrate — S2c

Rotating a polishing head and a polishing part — S21c

Changing pressures of a first zone and a second zone — S22c

Calculating polishing rates of a first substrate zone and a second substrate zone — S23c Determining a reference polishing rate — S24c Re-adjusting the changed pressure of the first zone — S25c

METHOD OF PROCESSING A SUBSTRATE

CROSS-REFERENCE TO RELATED APPLICATIONS

This U.S. non-provisional patent application claims priority under 35 U.S.C. § 119 to Korean Patent Application No. 10-2023-0123990, filed on Sep. 18, 2023, in the Korean Intellectual Property Office, the entire contents of which are hereby incorporated by reference.

BACKGROUND OF THE INVENTION

The present disclosure relates to a method of processing a substrate, and more particularly, to a method of processing a substrate that is capable of increasing a flatness of the substrate.

A semiconductor device may be manufactured through various processes. For example, a photolithography process, an etching process, a deposition process, etc. may be performed on a substrate to manufacture a semiconductor device. Before each of the processes, it may be required to planarize a surface of the substrate. To achieve this, a polishing process may be performed on the substrate. The polishing process may be performed by at least one of various methods. For example, a chemical mechanical polishing (CMP) process may be used to planarize the substrate.

SUMMARY

Embodiments of the inventive concepts may provide a method of processing a substrate in which a pressure applied to the substrate is adjusted in in real time in a substrate polishing process. In some embodiments, the method may adjust the pressure applied to the substrate in each of a plurality of zones of a pressure member in real time in the substrate polishing process.

Embodiments of the inventive concepts may also provide a method of processing a substrate in which a pressure applied to the substrate is adjusted in each of a plurality of zones without the use of a thickness measurement sensor for measuring the thickness of the substrate in a substrate polishing process.

Embodiments of the inventive concepts may further provide a method of processing a substrate in which a polishing amount and a polishing rate for the substrate is calculated without the use of a thickness measurement sensor for measuring the thickness of the substrate in a substrate polishing process.

In an aspect, a method of processing a substrate for manufacturing a semiconductor device may include disposing a substrate in a substrate processing apparatus and polishing the substrate. The substrate processing apparatus may include a polishing head configured to support the substrate and a polishing part located under the polishing head and configured to polish the substrate. The polishing head may include a polishing head body and a head support member coupled to a top of the polishing head body and configured to rotate the polishing head body. The polishing head body may include a pressure member including a first zone and a second zone that are configured to apply pressures in a vertical direction. The substrate may include a first substrate zone located under the first zone and a second substrate zone located under the second zone. The polishing of the substrate may include rotating the substrate while applying a (1,1)-th pressure to the first substrate zone and applying a (2,1)-th pressure to the second substrate zone, calculating a (1,1)-th polishing rate of the first substrate zone and a (2,1)-th polishing rate of the second substrate zone, determining a reference polishing rate using the (1,1)-th polishing rate and the (2,1)-th polishing rate, resetting a pressure, applied to the first substrate zone, to a (1,2)-th pressure based on the reference polishing rate, and calculating a (1,2)-th polishing rate of the first substrate zone based on the (1,2)-th pressure of the first zone.

In an aspect, a method of processing a substrate may include disposing a substrate in a substrate processing apparatus and polishing the substrate. The substrate processing apparatus may include a polishing head configured to support and rotate the substrate and a polishing part located under the polishing head and comprising a polishing pad configured to polish the substrate. The polishing head may include a first zone having a cylindrical shape in its central portion and configured to apply a pressure in a vertical direction and a second zone located outside the first zone, having a ring shape and configured to apply a pressure in the vertical direction. The substrate may include a first substrate zone located under the first zone and a second substrate zone located under the second zone. The polishing of the substrate may include rotating the polishing head and the polishing part, determining a reference polishing rate of the substrate, resetting a pressure applied to the first substrate zone by the first zone, based on the reference polishing rate, and calculating a polishing rate of the first substrate zone based on the reset pressure of the first zone.

In an aspect, a method of processing a substrate may include disposing a substrate in a substrate processing apparatus and polishing the substrate. The substrate processing apparatus may include a polishing head configured to support the substrate and a rotatable polishing part located under the polishing head and having a disc shape. The polishing head may include a pressure member configured to apply a pressure in a vertical direction. The pressure member may include a first zone having a cylindrical shape and a second zone having a ring shape surrounding the first zone. The substrate may include a first substrate zone configured to receive a pressure in the vertical direction from the first zone and a second substrate zone configured to receive a pressure in the vertical direction from the second zone. The polishing of the substrate may include rotating the polishing head and the polishing part, changing pressures of the first zone and the second zone, calculating polishing rates of the first substrate zone and the second substrate zone based on the changed pressures, determining a reference polishing rate based on the polishing rates of the first substrate zone and the second substrate zone, and re-adjusting the changed pressure of the first zone based on the reference polishing rate.

BRIEF DESCRIPTION OF THE DRAWINGS

FIG. 6 illustrates an equation for calculating a polishing amount of a substrate.

FIG. 7 illustrates Preston's equation which may be used for a polishing rate in each of zones of a substrate.

FIG. 8 is a flow block diagram schematically illustrating the method of processing a substrate according to the flow chart.

FIG. 11 is a flow chart illustrating a method of processing a substrate according to some embodiments of the inventive concepts.

DETAILED DESCRIPTION

Figure 1:
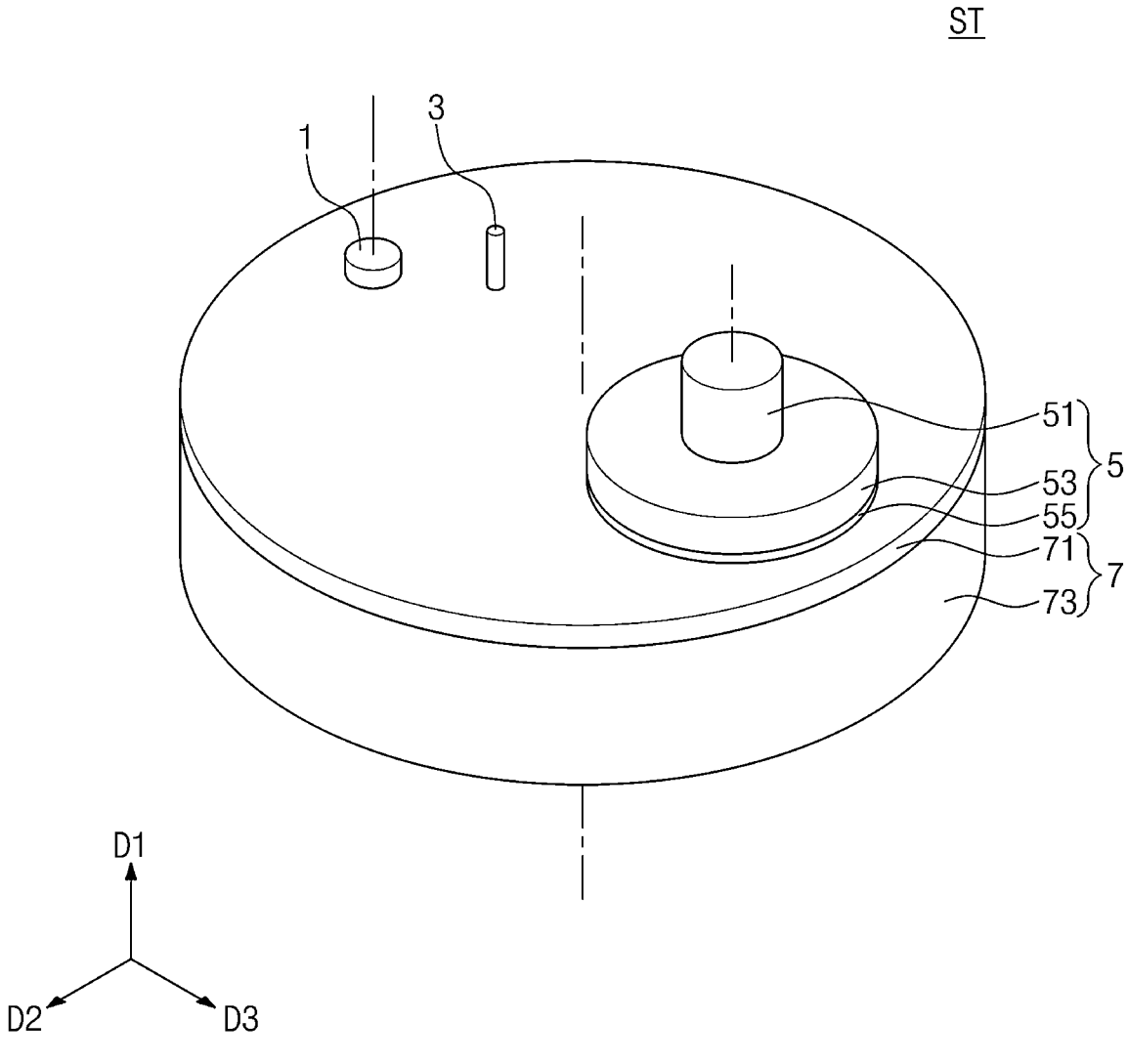
FIG. 1 is a perspective view illustrating a substrate processing apparatus according to some embodiments of the inventive concepts.

Hereinafter, embodiments of the inventive concepts will be described in detail with reference to the accompanying drawings. The same reference numerals or the same reference designators may denote the same or substantially similar components or elements throughout the specification.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

It will be appreciated that "planarization," "co-planar," "planar," etc., as used herein refer to structures (e.g., surfaces) that need not be perfectly geometrically planar, but may include acceptable variances that may result from standard manufacturing processes.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Hereinafter, a reference designator D1 may be referred to as a first direction, a reference designator D2 intersecting the first direction D1 may be referred to as a second direction, and a reference designator D3 intersecting both the first direction D1 and the second direction D2 may be referred to as a third direction. Each of the directions D1, D2, D3, may be orthogonal to one another to form a coordinate system. The first direction D1 may also be referred to as an upward direction, and an opposite direction to the first direction D1 may also be referred to as a downward direction. In addition, each of the second direction D2 and the third direction D3 may be referred to as a horizontal direction.

Figure 2:
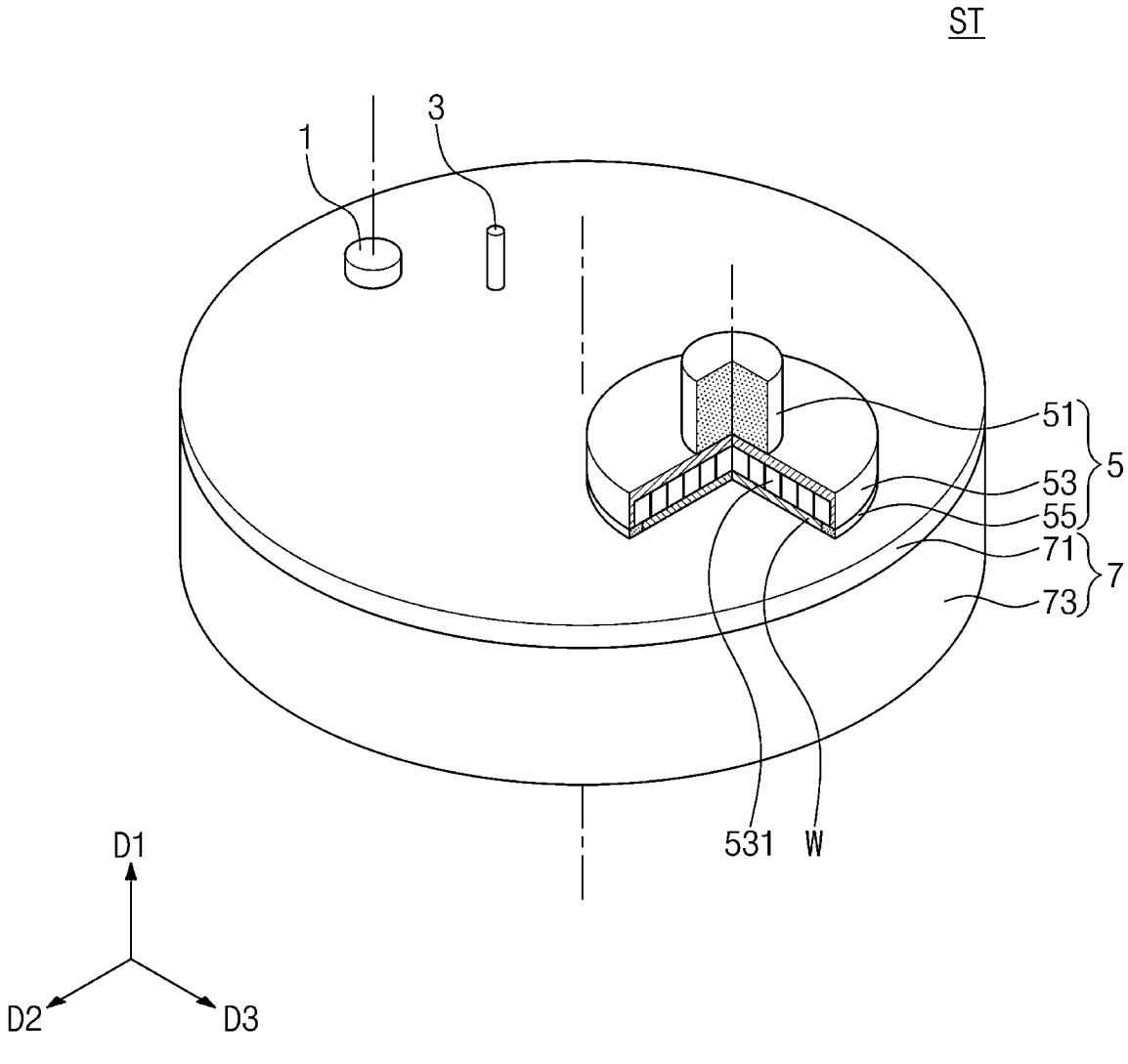
FIG. 2 is a partially cut perspective view illustrating a substrate processing apparatus according to some embodiments of the inventive concepts.
Figure 3:
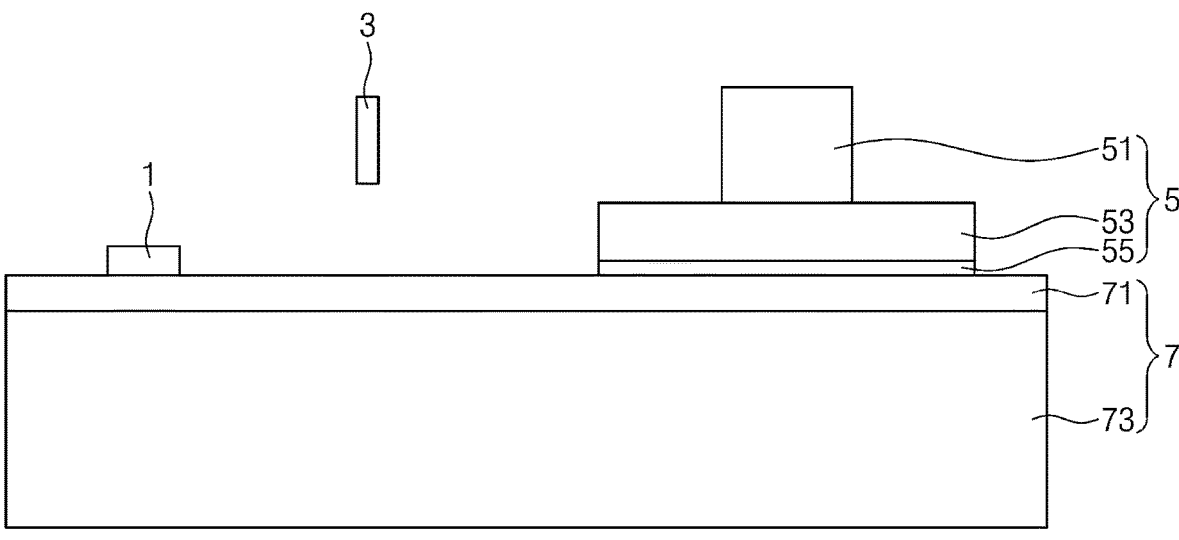
FIG. 3 is a front view illustrating a substrate processing apparatus according to some embodiments of the inventive concepts.
Figure 3:
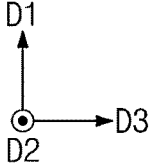
Figure 4:
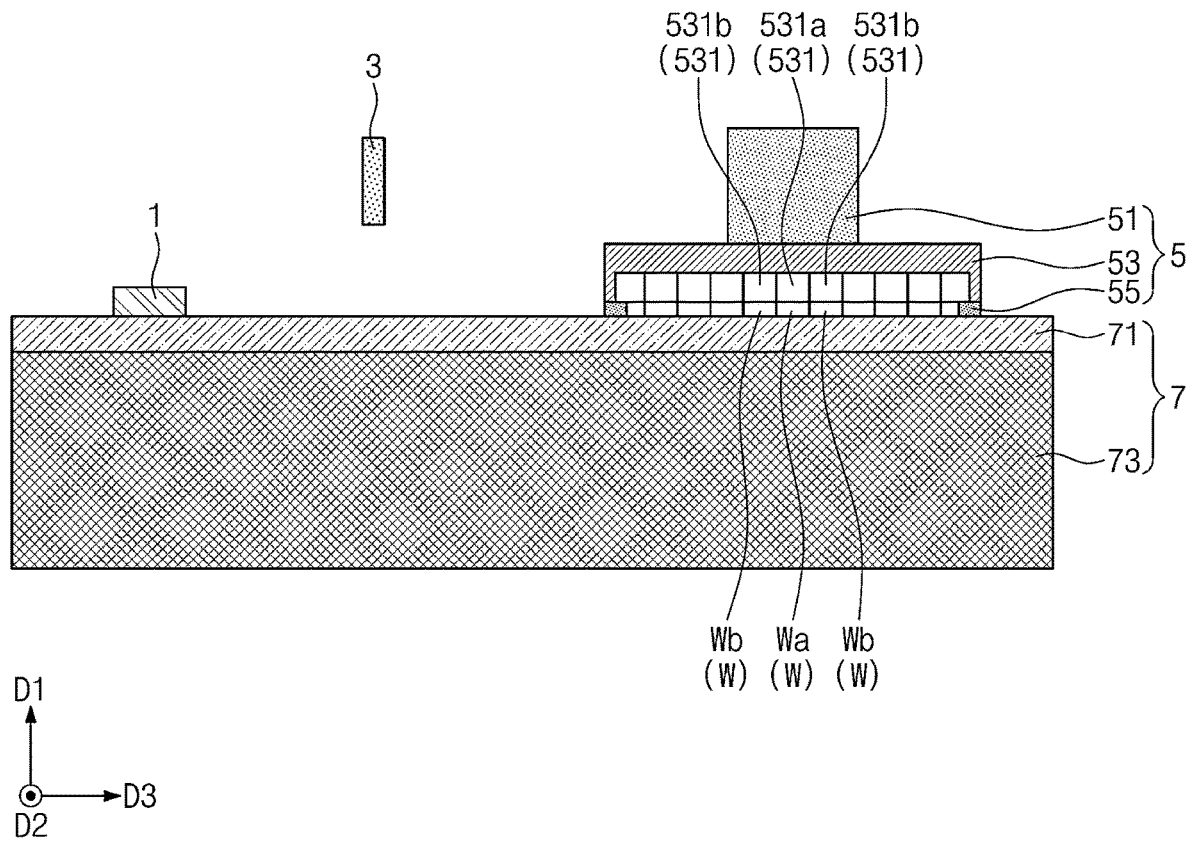
FIG. 4 is a cross-sectional view illustrating a substrate processing apparatus according to some embodiments of the inventive concepts.

FIG. 1 is a perspective view illustrating a substrate processing apparatus ST according to some embodiments of the inventive concepts, FIG. 2 is a partial section perspective view illustrating the substrate processing apparatus ST according to some embodiments of the inventive concepts, FIG. 3 is a front view illustrating the substrate processing apparatus ST according to some embodiments of the inventive concepts, and FIG. 4 is a cross-sectional view illustrating the substrate processing apparatus ST according to some embodiments of the inventive concepts.

Referring to FIG. 1, the substrate processing apparatus ST may be provided. The substrate processing apparatus ST may be a chemical mechanical polishing apparatus. A method of processing a substrate (S, see FIG. 5) may include a method of polishing the substrate W. A process of processing the substrate W may include a process of polishing the substrate W. However, embodiments of the inventive concepts are not limited thereto. In the present specification, the process of processing the substrate W may be referred to as the method of polishing the substrate W for the purpose of ease and convenience in explanation. The substrate processing apparatus ST may be configured to polish one surface of the substrate W as part of a process for manufacturing a semiconductor. In the present specification, the substrate W may be a silicon (Si) wafer, but embodiments of the inventive concepts are not limited thereto. The substrate processing apparatus ST may include a polishing part 7, a conditioning unit 1, a slurry supply unit 3, and a polishing head 5.

The polishing part 7 may include a polishing pad 71 and a platen 73.

The polishing pad 71 may have a disc shape. The polishing pad 71 may be disposed on a top surface of the platen 73. More particularly, a bottom surface of the polishing pad 71 may be in contact with the top surface of the platen 73. A center of rotation of the polishing pad 71 may be located on the same line (i.e., a rotation axis which may be parallel to the first direction D1) as a center of rotation of the platen 73. The polishing pad 71 may be configured to polish the substrate W. The polishing pad 71 may be rotatable. More particularly, the polishing pad 71 may rotate about a rotation axis parallel to the first direction D1 and which may be offset horizontally from the rotation axis of the polishing pad. A top surface of the rotating polishing pad 71 may come in contact with the substrate W to polish a bottom surface of the substrate W. The polishing pad 71 may be divided into a plurality of regions, but embodiments of the inventive concepts are not limited thereto.

The platen 73 may support the polishing pad 71. The platen 73 may be configured to rotate the polishing pad 71. More particularly, the platen 73 may be rotated by a driving unit such as an electric motor or other actuator to rotate the polishing pad 71. In embodiments in which the polishing pad 71 has a disc shape, the platen 73 may also have a disc shape. The polishing pad 71 may be rotated by the rotation of the platen 73, thereby polishing the substrate W. For example, the polishing pad 71 may be coupled to the platen 73 such that motion of the platen causes the polishing pad 71 to move in a corresponding motion.

The conditioning unit 1 may be configured to polish a portion of the polishing pad 71. The conditioning unit 1 may be selectively in contact with the top surface of the polishing pad 71. While the polishing pad 71 is rotated, the conditioning unit 1 may come in contact with the top surface of the polishing pad 71. A state of the top surface of the polishing pad 71 may be changed by the polishing of the conditioning unit 1 while the polishing process is performed on the substrate W. For example, the conditioning unit 1 may polish the polishing pad 71 to improve a state of the polishing pad 71. The conditioning unit 1 may be rotatable independently of the polishing part 7. A relative rotational speed of the conditioning unit 1 to the polishing part 7 may be changed dynamically. The relative rotational speed may be changed according to a time, such as an elapsed time. A relative position of the conditioning unit 1 on the polishing part 7 may be changed dynamically. The relative position may be changed according to a time, such as an elapsed time. More particularly, the conditioning unit 1 may be movable on the polishing pad 71 in a horizontal direction. The conditioning unit 1 may be moveable relative to the polishing pad in a vertical direction. For example, the conditioning unit 1 may be configured to rise in the upward direction from a place (location) where a bottom surface of the conditioning unit 1 is in contact with the polishing pad 71 to a place (location) where the bottom surface of the conditioning unit 1 is not in contact with the polishing pad 71.

The slurry supply unit 3 may be configured to selectively supply slurry to the polishing pad 71. For example, the slurry supply unit 3 may be a channel or pipe in fluid communication with a source of slurry and a valve for selectively regulating the supply of the slurry. More particularly, the slurry supply unit 3 may be configured to supply the slurry to the top surface of the polishing pad 71 to facilitate smoothly performing the polishing process on the substrate W. The slurry supply unit 3 may be spaced apart from the polishing pad 71. In addition, the slurry supply unit 3 may be located between the conditioning unit 1 and a head support member 51 in a horizontal direction and/or a rotational direction. For example, the slurry supply unit 3 may be disposed between the conditioning unit 1 and the polishing head 5 with respect to a rotation direction of the platen 73. More particularly, the slurry supply unit 3 may be disposed between a rear end of the conditioning unit 1 and a front end of the polishing head 5 with respect to the rotation direction of the platen 73.

The polishing head 5 may be configured to support and/or rotate the substrate W. More particularly, the polishing head 5 may be configured to support the substrate W with the substrate disposed on the polishing pad 71 in such a way that one surface of the substrate W faces the polishing pad 71. The polishing head 5 may be rotatable independently of the polishing part 7. A relative rotational speed of the polishing head 5 to the polishing part 7 may be changed dynamically. The relative rotational speed may be changed according to a time, such as an elapsed time. A relative position of the polishing head 5 on the polishing part 7 may be changed dynamically. The relative position may be changed according to a time, such as an elapsed time. More particularly, the polishing head 5 may be movable on the polishing pad 71 in a horizontal direction. The polishing head 5 may be moveable relative to the polishing pad in a vertical direction. The polishing head may be configured to rise in the upward direction from a place (location) where the bottom surface of the substrate W is in contact with the polishing pad 71 to a place (location) where the bottom surface of the substrate is not in contact with the polishing pad 71. The polishing head 5 may include the head support member 51, a polishing head body 53, and a retainer ring 55.

The head support member 51 may be configured to position the substrate W such that the substrate W may be disposed at a certain position on the polishing pad 71. The head support member 51 may be coupled to a top of the polishing head body 53. The head support member 51 may be configured to rotate the polishing head body 53. For example, the head support member 51 may include a rotary motor to rotate the substrate W or the head support member

51 may be rotated by an external source. The substrate W may be polished on the polishing pad 71.

The polishing head body 53 may be configured to support the substrate W. For example, the retainer ring 55 and the substrate W may be coupled to a bottom surface of the polishing head body 53. More particularly, the polishing head body 53 may be configured to adsorb the substrate W on its bottom surface by using a vacuum pressure. For this, the polishing head body 53 may include a porous structure with pores exposed at its bottom surface. A vacuum pressure in the pores may secure the substrate against the bottom surface. The polishing head body 53 may be configured to apply a pressure to the substrate W resulting in a downward force which may be independent of the vacuum pressure. The pressure and/or force applied by the polishing head body 53 may be referred to hereafter as a pressure with the understanding that the pressure results in a downward force applied to the substrate for a given area which may be referred to as a zone. The polishing head body 53 may include a pressure member 531. The pressure member 531 may include a plurality of zones configured to apply pressures to the substrate W in a downward, vertical direction. The zones of the pressure member 531 may be configured to apply different magnitudes of pressure to different substrate zones of the substrate W. In the following description, when referring to the pressure, unless otherwise indicated by the context, it will be understood that the magnitude of the pressure is being referred to. The pressure member 531 may be configured to adjust a pressure applied to the substrate W in each of the zones. For example, the pressure member 531 may have actuators for applying a downward pressure on the substrate W or may house pressurized fluid for applying a downward pressure. The pressure member 531 may have n zones. Here, 'n' may be a natural number that identifies a particular zone. For example, the pressure member 531 may include a first zone 531a having a cylindrical shape in its central portion. The pressure member 531 may further include a second zone 531b located outside the first zone 531a and having a ring shape. In other words, the pressure member 531 may include the first zone 531a and the second zone 531b. However, embodiments of the inventive concepts are not limited thereto, and in certain embodiments, the pressure member 531 may include three or more zones. Hereinafter, the first zone 531a and the second zone 531b will be described as an example for the purpose of ease and convenience in explanation. The substrate W may include a n-th substrate zone located under a n-th zone of the pressure member 531. The n-th substrate zone may receive a pressure from the n-th zone in the vertical direction. For example, the substrate W may include a first substrate zone Wa located under the first zone 531a. The substrate W may further include a second substrate zone Wb located under the second zone 531b. For example, the substrate W may include the first substrate zone Wa and the second substrate zone Wb. However, embodiments of the inventive concepts are not limited thereto, and in certain embodiments, the substrate W may include three or more substrate zones. In the following description, the notation (n,t) may be used to designate the magnitude of a pressure of a n-th zone at a t-th segment of time where n identifies the zone and t identifies a time segment. The variables t may represent a natural number that increases by 1 with each new time segment. The first zone 531a may apply a (1,t)-th pressure to the first substrate zone Wa. If the pressure applied by the first zone changes, t may increase such that the new magnitude of pressure may be identified as the (1, t+1)-th pressure. The second zone 531b may apply a (2, t)-th pressure to the second substrate zone Wb. If the pressure applied by the second zone changes, t may increase such that the new magnitude of pressure may be identified as the (2, t+1)-th pressure. Hereinafter, the first substrate zone Wa and the second substrate zone Wb will be described as an example for the purpose of ease and convenience in explanation. A first pressure applied from the first zone 531a to the first substrate zone Wa may be changed. A second pressure applied from the second zone 531b to the second substrate zone Wb may be changed. The head support member 51 may be coupled to a top surface of the polishing head body 53.

The retainer ring 55 may be configured to support the substrate W. The retainer ring 55 may surround a circumference of the substrate W. The retainer ring 55 may be coupled to the polishing head body 53. More particularly, a top surface of the retainer ring 55 may be in contact with the polishing head body 53. The top surface of the retainer ring 55 may be coupled to the polishing head body 53. The retainer ring 55 may provide a slurry groove (not shown). The slurry groove may be recessed upward from a bottom surface of the retainer ring 55 toward the top surface of the retainer ring 55. The slurry groove may have a straight or curved shape. The slurry provided by the slurry supply unit may be provided/exhausted to/from the substrate W through the slurry groove.

The polishing head 5 may further include a pressure control unit (not shown) configured to control the pressure applied by the pressure member 531. The pressures applied by the first zone 531a and the second zone 531b may be controlled by the pressure control unit. The pressure control unit may also be configured to measure the pressures applied by the first zone 531a and the second zone 531b. The pressure control unit may be a computer or processor and may include, for example, one or more processors configured by software, such as a CPU (Central Processing Unit), GPU (graphics processor), controller, etc. As is understood, "software" refers to prescribed rules to operate a processor, such as code or script. The software may be stored conventional memory of a computer, such as a hard drive (which may be a solid state drive, DRAM, NAND flash memory, etc.). The pressure control unit may provide a control signal to an actuator that provides the pressure applied by the pressure member. For example, the control unit may provide a control signal to a pressure valve for adjusting the pressure of a fluid in the pressure member. The pressure control unit may include a pressure sensor configured to measure the pressure applied by the first zone 531a and the second zone 531b.

Figure 5:
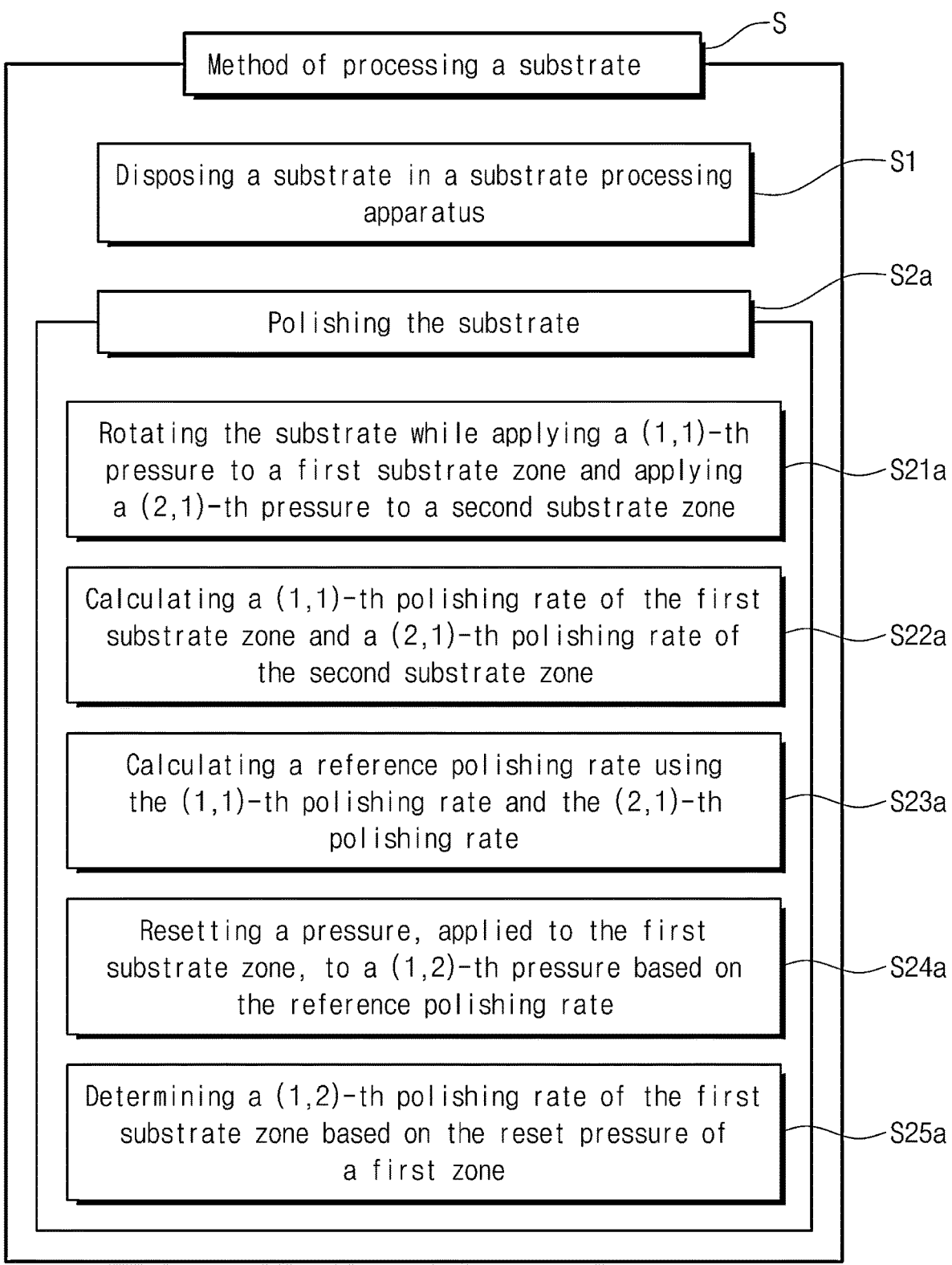
FIG. 5 is a flow chart illustrating a method of processing a substrate according to some embodiments of the inventive concepts.
Figure 8:
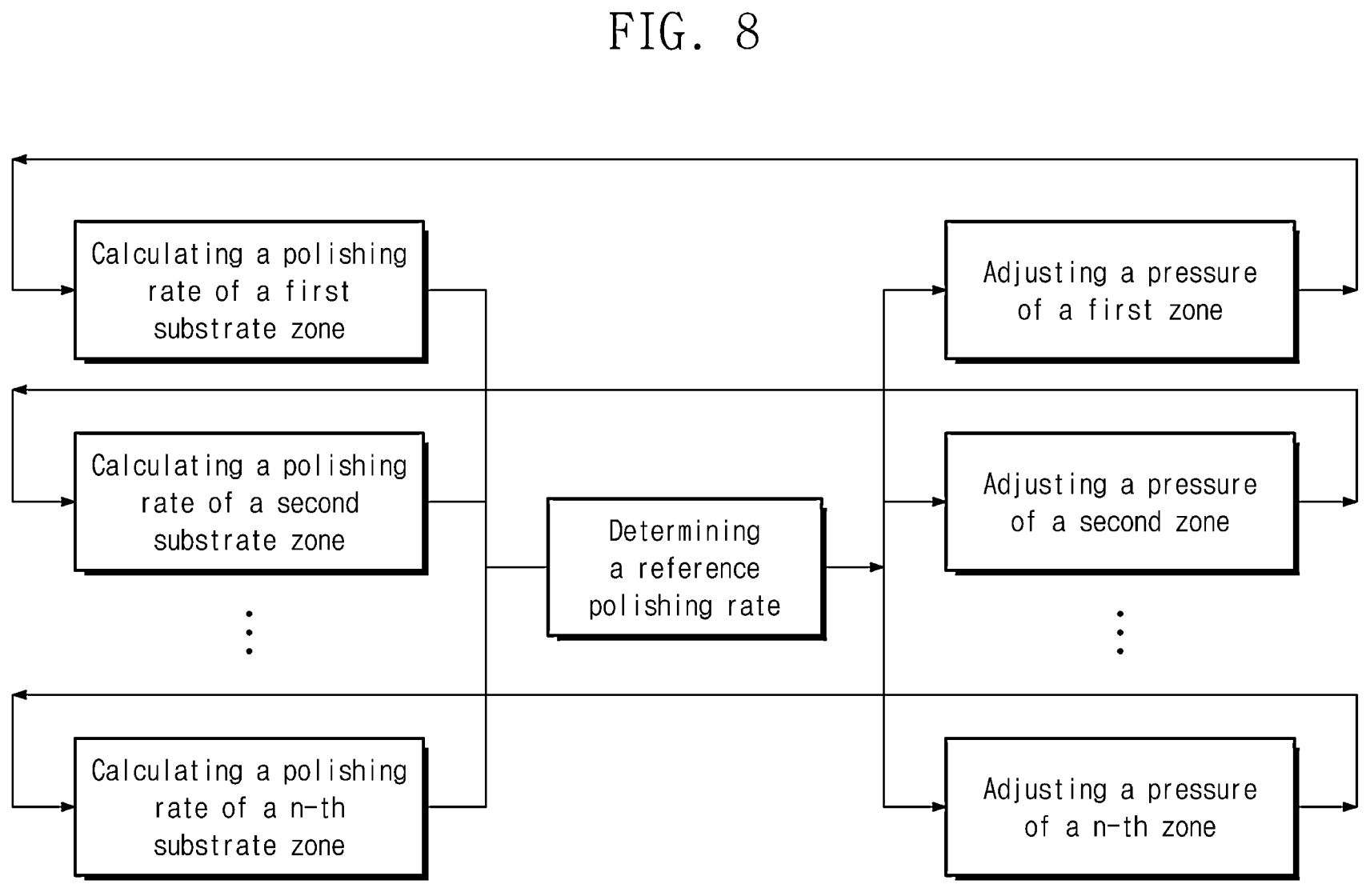
Figure 9:
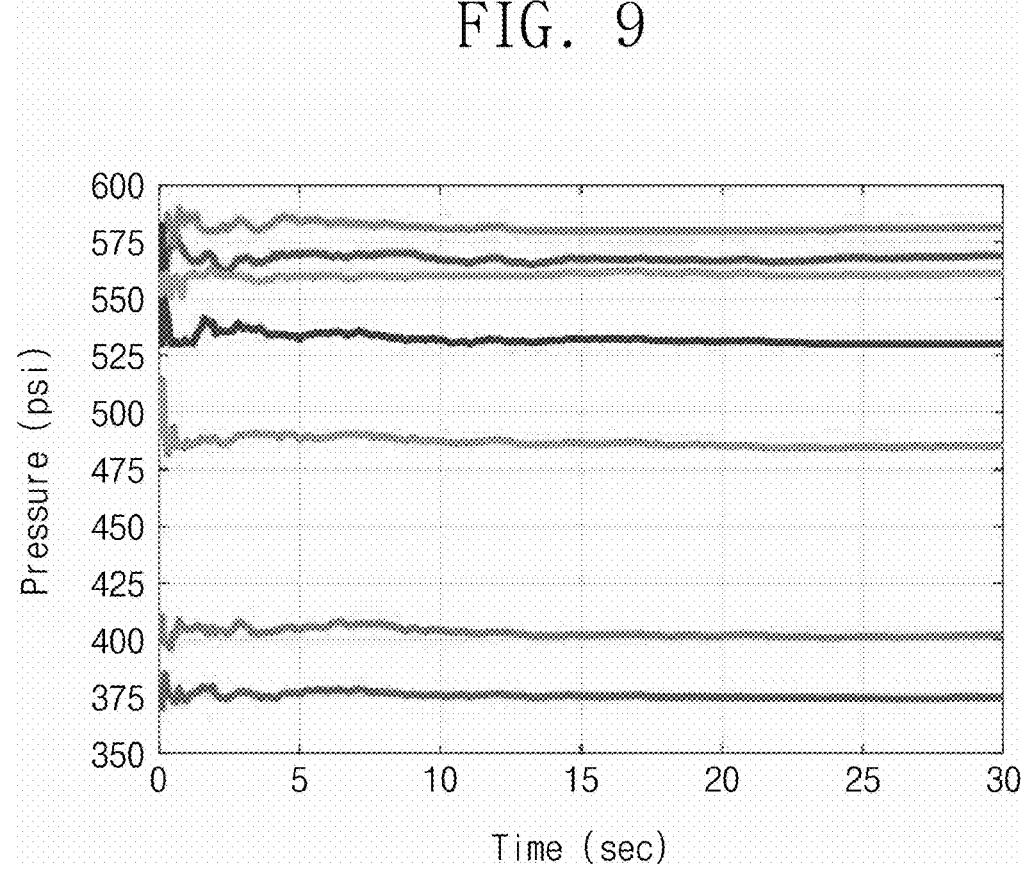
FIG. 9 is a graph showing pressure changes shown in zones of a pressure member when the method of processing a substrate according to the flow chart is performed.

FIG. 5 is a flow chart illustrating a method of processing a substrate according to some embodiments of the inventive concepts, FIG. 6 illustrates an equation capable of calculating a polishing amount of a substrate, FIG. 7 illustrates Preston's equation capable of calculating a polishing rate in each of zones of a substrate, FIG. 8 is a flow block diagram schematically illustrating the method of processing a substrate according to the flow chart, and FIG. 9 is a graph showing pressure changes shown in zones of a pressure member when the method of processing a substrate according to the flow chart is performed.

Referring to FIG. 5, a method of processing a substrate (S) is illustrated. The method of processing a substrate (S) may include disposing the substrate W in the substrate processing apparatus ST (S1) and polishing the substrate W (S2a). The polishing of the substrate W (S2a) may include rotating the substrate W while applying a (1–,1)-th pressure to the first substrate zone Wa using the first zone 531a and applying a (2–,1)-th pressure to the second substrate zone Wb using the second zone 531b (S21a), calculating a (1,1)-th polishing rate of the first substrate zone Wa and a (2,1)-th polishing rate of the second substrate zone Wb (S22a), determining a reference polishing rate using the (1–,1)-th polishing rate and the (2–,1)-th polishing rate (S23a), adjusting the pressure applied to the first substrate zone Wa, to a (1–,2)-th pressure based on the reference polishing rate (S24a), and calculating a (1–,2)-th polishing rate of the first substrate zone Wa based on the adjusted pressure of the first zone 531a (S25a).

The disposing of the substrate W in the substrate processing apparatus ST (S1) may include disposing the substrate W on the bottom surface of the polishing head body 53. More particularly, the substrate W may be attached or adsorbed on the bottom surface of the polishing head body 53 by a vacuum pressure as described previously. The disposing of the substrate W in the substrate processing apparatus ST (S1) may further include supporting the substrate W with the retainer ring 55.

$P_{n,t}$ (see FIG. 6) may be a t-th pressure of the n-th zone. The $P_{n,t}$ may mean a (n,t)-th pressure. For example, $P_{1,2}$ may be a second pressure of the first zone 531a. The $P_{1,2}$ may be referred to as the (1,2)-th pressure. The $P_{n,t}$ may be changed over time. The applying of the (1,1)-th pressure to the first substrate zone Wa may include applying the (1,1)-th pressure to the first substrate zone Wa by the first zone 531a. The first zone 531a may press the first substrate zone Wa with the $P_{1,1}$. The applying of the (2,1)-th pressure to the second substrate zone Wb may include applying the (2,1)-th pressure to the second substrate zone Wb by the second zone 531b. The second zone 531b may press the second substrate zone Wb with the $P_{2,1}$. The polishing head 5 may rotate the substrate W while applying different pressures to the first substrate zone Wa and the second substrate zone Wb by using the first zone 531a and the second zone 531b of the pressure member 531.

Referring to FIGS. 6 and 7, equations for calculating a polishing amount (e.g., a total amount of material removed) and a polishing rate (e.g., an amount of material removed per unit of time) of each of zones are shown. The equations are based on Preston's equation which posits that the amount of material removed is proportional to the applied pressure and the relative velocity, wherein the proportionality is called Preston's constant K. The polishing of the substrate W (S2a) may include calculating a Preston's constant K for the first substrate zone Wa before the calculating the (1,1)-th polishing rate and the (2,1)-th polishing rate (S22a). The calculating of the Preston's constant for the first substrate zone Wa may be performed using Preston's equation. The calculating of the Preston's constant may use the equation of FIG. 6.

In FIG. 6, $K_n$ may represent a Preston's constant of the n-th substrate zone of the substrate W. For example, $K_n$ may represent the Preston's constant of the first substrate zone Wa. In FIG. 6, $V_{n,t}$ may be an average relative velocity between the n-th substrate zone and the polishing pad 71 during the time t. For example, $V_{1,1}$ may mean a first average relative velocity of the first substrate zone Wa to the polishing pad 71 during time 1. The $V_{n,t}$ may be changed over time. The $V_{n,t}$ may be changed in each of the substrate zones over time. 't' may be a number of a round. 't' may mean a time. '$t_0$' may mean a start time. '$t_0$' may mean a starting round.

Calculating Preston's constant may be based on previous experimentation or modeling. For example, $V_{n,t}$ and the $P_{n,t}$ may be previously measured values such as values used during a test process. The $V_{n,t}$ and the $P_{n,t}$ may be known values or previously used values. The polishing amount may be a target polishing amount of the substrate W or a measured amount for a previous process. The polishing amount may be a difference between a thickness of an unpolished substrate W and a thickness of a polished substrate W. Since the polishing amount, the $V_{n,t}$ and the $P_{n,t}$ are known (e.g., the polishing amount measured in a completed process, the value of $V_{n,t}$ used during the completed process, and the value of $P_{n,t}$ used during the completed process may each be recorded and stored for the completed process), the $K_n$ may be calculated using a formula such as the formula of FIG. 6. The Preston's constants $K_n$ of the substrate zones may be different from each other and may be calculated separately.

Referring to FIG. 7, the calculating of the (1,1)-th polishing rate of the first substrate zone Wa and the (2,1)-th polishing rate of the second substrate zone Wb (S22a) may include using the equation of FIG. 7. A polishing rate of the n-th substrate zone may be referred to as a n-th polishing rate. The n-th polishing rate calculated at the start of the process of processing the substrate W may be referred to as a (n,1)-th polishing rate. Hereinafter, a method of calculating a polishing rate and a pressure for polishing the first substrate zone Wa and the first zone 531a will be described as an example of a method of calculating a polishing rate and a pressure for the purpose of ease and convenience in explanation. The method of calculating the polishing rate and the pressure for polishing the first substrate zone Wa and the first zone 531a may be similarly applied to the second substrate zone Wb and the second zone 531b. The Preston's constant $K_1$ of the first substrate zone Wa may be the value calculated as described above. $V_{1,t}$ and $P_{1,t}$ may be calculated values or known values. Since 't' and '$t_0$' are also known values, the (1,1)-th polishing rate of the first substrate zone Wa may be calculated using the equation of FIG. 7. Polishing rates of the second substrate zone Wb and other zones of the substrate W may be calculated by the same method as described above. A second polishing rate for polishing the second substrate zone Wb calculated at the start of the process of processing the substrate W may be referred to as the (2,1)-th polishing rate.

Referring to FIG. 8, the flow block diagram schematically illustrating the order of the method of processing a substrate (S) may be provided. The polishing rate of each of the substrate zones may be calculated, and then, the reference polishing rate may be determined (S23a). The reference polishing rate may be determined using the calculated (1,1)-th polishing rate and the calculated (2,1)-th polishing rate. The reference polishing rate may be an average value of the (1,1)-th polishing rate and the (2,1)-th polishing rate. Alternatively, the reference polishing rate may be one of the (1,1)-th polishing rate and the (2,1)-th polishing rate, and may be selected based on a polishing rate that is closer to the average value of the (1,1)-th polishing rate and the (2,1)-th polishing rate. However, the method of determining the reference polishing rate is not limited thereto.

After the determining of the reference polishing rate, the pressure applied to the first substrate zone Wa may be set to the (1,2)-th pressure (S24a). The pressure applied by the first zone 531a may be changed from the (1,1)-th pressure to the (1,2)-th pressure. The (1,2)-th pressure may be equal to a value obtained by multiplying the (1,1)-th pressure by a first ratio of the first polishing rate of the first substrate zone Wa to the reference polishing rate. Likewise, a (2,2)-th pressure may also be calculated using the (2,1)-th pressure and the reference polishing rate.

The set (1,2)-th pressure may be used to calculate the polishing rate of the first substrate zone Wa again. For example, the (1,2)-th pressure may be used to calculate a (1,2)-th polishing rate. The $K_1$ may be a known value. The $V_{1,2}$ and the $P_{1,2}$ (i.e., the (1,2)-th relative velocity and pressure) may be measured values or known values. Thus, the (1,2)-th polishing rate may be calculated using the equation of FIG. 6. A (2,2) polishing rate may be calculated by the same method described above. As shown in FIG. 8, when the polishing rate of each of the substrate zones is calculated, the reference polishing rate may be calculated based on the calculated polishing rate of each of the substrate zones. The pressure of each of the zones of the pressure member 531 may be adjusted again. The process of calculating the polishing rate of each of the substrate zones, the process of calculating the reference polishing rate, and the process of re-adjusting the pressure of each of the zones of the pressure member 531 may be continuously repeated in the process of polishing the substrate W. Referring to FIG. 9, a graph showing the pressure of each of the zones of the pressure member 531 over time is shown. A horizontal axis of the graph of FIG. 9 represents time. A vertical axis of the graph represents pressure. The pressure of each of the zones of the pressure member may have a value continuously changed in the process of polishing the substrate W and is thus not a single value. Since the pressure of each of the zones of the pressure member is changed during the polishing process, the flatness of a substrate may be improved.

Figure 10:
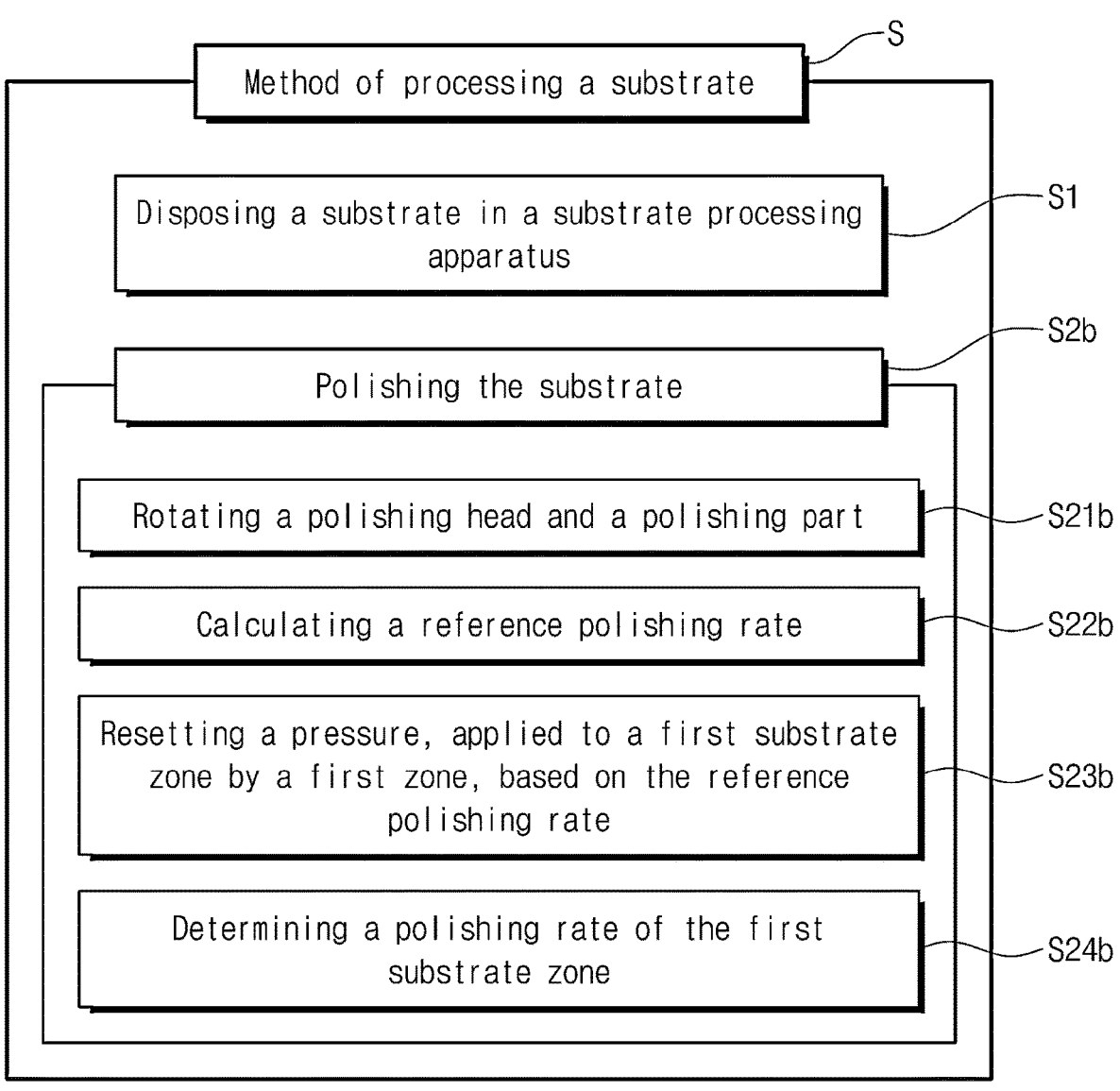
FIG. 10 is a flow chart illustrating a method of processing a substrate according to some embodiments of the inventive concepts.

FIG. 10 is a flow chart illustrating a method of processing a substrate according to some embodiments of the inventive concepts, and FIG. 11 is a flow chart illustrating a method of processing a substrate according to some embodiments of the inventive concepts.

Referring to FIG. 10, a method of processing a substrate (S) is provided. The method of processing a substrate (S) may include disposing the substrate W in a substrate processing apparatus ST (S1) and polishing the substrate W (S2b). The polishing of the substrate W (S2b) may include rotating the polishing head 5 and the polishing part 7 (S21b), determining a reference polishing rate (S22b), setting a pressure applied to the first substrate zone Wa by the first zone 531a based on the reference polishing rate (S23b), and calculating a polishing rate of the first substrate zone Wa (S24b).

Referring to FIG. 11, a method of processing a substrate (S) may include disposing the substrate W in the substrate processing apparatus ST (S1) and polishing the substrate W (S2c). The polishing of the substrate W (S2c) may include rotating the polishing head 5 and the polishing part 7 (S21c), changing pressures of the first zone 531a and the second zone 531b (S22c), calculating polishing rates of the first substrate zone Wa and the second substrate zone Wb (S23c), determining a reference polishing rate (S24c), and re-adjusting the changed pressure of the first zone 531a (S25c).

According to the method of processing a substrate in the embodiments of the inventive concepts, the pressure of each of the zones of the pressure member may be controlled in real time without a thickness measurement sensor of the substrate in the process of polishing a substrate. The thickness measurement sensor of the substrate may be used before the start of the process of polishing a substrate. The thickness measurement sensor of the substrate may be used when calculating the Preston's constant of the substrate. The thickness measurement sensor of the substrate may not be used after the start of the process of polishing a substrate.

According to the method of processing a substrate in the embodiments of the inventive concepts, the pressure, applied to the substrate, of each of the zones of the pressure member may be adjusted in real time in the process of polishing a substrate. In the method of processing a substrate, the polishing rate of each of the substrate zones may be measured. The reference polishing rate may be calculated based on the measured polishing rate of each of the substrate zones. The method of determining the reference polishing rate may be one of various methods. The pressure applied to the substrate of each of the zones of the pressure member may be re-adjusted based on the reference polishing rate. The substrate may be polished while applying the re-adjusted pressure to the substrate. The above processes may be continuously repeated while measuring the polishing rate of each of the substrate zones of the substrate again. The flatness of the substrate may be improved while adjusting the pressure, applied to the substrate, in real time in the process of polishing a substrate.

According to the method of processing a substrate in the inventive concepts, the pressure applied to the substrate may be adjusted in real time in the process of polishing the substrate.

According to the method of processing a substrate in the inventive concepts, the pressure, applied to the substrate, of each of the zones may be adjusted without using the thickness measurement sensor of the substrate.

According to the method of processing a substrate in the inventive concepts, the polishing amount and the polishing rate of the substrate may be calculated without using the thickness measurement sensor in the process of polishing the substrate.

What is claimed is:

1. A method of processing a substrate for manufacturing a semiconductor device, the method comprising:
disposing a substrate in a substrate processing apparatus; and
polishing the substrate,
wherein the substrate processing apparatus comprises:
a polishing head configured to support the substrate; and
a polishing part located under the polishing head and configured to polish the substrate,
wherein the polishing head comprises:
a polishing head body; and
a head support member coupled to a top of the polishing head body and configured to rotate the polishing head body,
wherein the polishing head body comprises:
a pressure member including a first zone and a second zone that are configured to apply pressures in a vertical direction,
wherein the substrate includes:
a first substrate zone located under the first zone; and
a second substrate zone located under the second zone,
wherein the polishing of the substrate comprises:
rotating the substrate while applying a (1,1)-th pressure with the first zone to the first substrate zone and applying a (2,1)-th pressure with the second zone to the second substrate zone;
calculating a (1,1)-th polishing rate of the first substrate zone and a (2,1)-th polishing rate of the second substrate zone;
determining a reference polishing rate using the (1,1)-th polishing rate and the (2,1)-th polishing rate;
resetting a pressure of the first zone applied to the first substrate zone to a (1,2)-th pressure based on the reference polishing rate; and calculating a (1,2)-th polishing rate of the first substrate zone based on the (1,2)-th pressure of the first zone.

2. The method of claim 1, wherein the determining of the reference polishing rate comprises:
selecting an average value of the (1,1)-th polishing rate and the (2,1)-th polishing rate as the reference polishing rate.

3. The method of claim 1, wherein the determining of the reference polishing rate comprises:
selecting one of the (1,1)-th polishing rate and the (2,1)-th polishing rate that is closer to an average value of the (1,1)-th polishing rate and the (2,1)-th polishing rate as the reference polishing rate.

4. The method of claim 1, wherein the (1,2)-th pressure is equal to a value obtained by multiplying the (1,1)-th pressure by a first ratio of a polishing rate of the first substrate zone to the reference polishing rate.

5. The method of claim 1, wherein the polishing of the substrate further comprises:
calculating a Preston's constant of the first substrate zone before the calculating of the (1,1)-th polishing rate and the (2,1)-th polishing rate.

6. The method of claim 5, wherein calculating the (1,1)-th polishing rate and the (2,1)-th polishing rate is based on a targeted polishing amount of the substrate.

7. The method of claim 1, wherein the polishing part comprises:
a rotatable polishing pad configured to polish a substrate; and
a platen supporting the polishing pad and configured to rotate the polishing pad.

8. The method of claim 7, wherein the substrate processing apparatus further comprises:
a slurry supply unit configured to supply slurry to the polishing pad; and
a conditioning unit configured to polish the polishing pad.

9. The method of claim 1, wherein the polishing head further comprises:
a pressure control unit configured to control a pressure applied by the pressure member.

10. The method of claim 9, wherein the calculating of the (1,1)-th polishing rate comprises:
using the (1,1)-th pressure measured by the pressure control unit.

11. A method of processing a substrate, the method comprising:
disposing a substrate in a substrate processing apparatus; and
polishing the substrate,
wherein the substrate processing apparatus comprises:
a polishing head configured to support and rotate the substrate; and
a polishing part located under the polishing head and comprising a polishing pad configured to polish the substrate,
wherein the polishing head comprises:
a first zone having a cylindrical shape in its central portion and configured to apply a pressure in a vertical direction; and
a second zone located outside the first zone, having a ring shape and configured to apply a pressure in the vertical direction,
wherein the substrate includes:
a first substrate zone located under the first zone; and
a second substrate zone located under the second zone,
wherein the polishing of the substrate comprises:
rotating the polishing head and the polishing part;

13 determining a reference polishing rate of the substrate;

resetting a pressure applied to the first substrate zone by the first zone, based on the reference polishing rate; and calculating a polishing rate of the first substrate zone based on the reset pressure of the first zone.

12. The method of claim 11, wherein the polishing of the substrate further comprises:

calculating a Preston's constant for each of the first substrate zone and the second substrate zone after the rotating of the polishing head and the polishing part.

13. The method of claim 12, wherein the calculating of the Preston's constant comprises: using average relative velocities of the first zone and the second zone to the polishing pad.

14. The method of claim 11, wherein the rotating of the polishing head comprises:

rotating the substrate while applying a (1,1)-th pressure to the first substrate zone and applying a (2,1)-th pressure to the second substrate zone.

15. The method of claim 14, wherein the resetting of the pressure applied to the first substrate zone by the first zone comprises:

resetting the (1,1)-th pressure to a (1,2)-th pressure based on the reference polishing rate.

16. The method of claim 14, wherein the first substrate zone has a (1,1)-th polishing rate and the second substrate zone has a (2,1)-th polishing rate in the rotating of the polishing head.

17. The method of claim 16, wherein the polishing of the substrate further comprises:

resetting the (2,1)-th pressure to a (2,2)-th pressure based on the reference polishing rate; and calculating a (2,2)-th polishing rate of the second substrate zone based on the (2,2)-th pressure.

18. The method of claim 16, wherein the calculating of the reference polishing rate comprises:

selecting an average value of the (1,1)-th polishing rate and the (2,1)-th polishing rate as the reference polishing rate.

19. The method of claim 16, wherein the calculating of the reference polishing rate comprises:

selecting one of the (1,1)-th polishing rate and the (2,1)-th polishing rate, which is closer to an average value of the (1,1)-th polishing rate and the (2,1)-th polishing rate, as the reference polishing rate.

20. A method of processing a substrate, the method comprising:

disposing a substrate in a substrate processing apparatus; and polishing the substrate, wherein the substrate processing apparatus comprises:

a polishing head configured to support a substrate; and a rotatable polishing part located under the polishing head and having a disc shape, wherein the polishing head comprises:

a pressure member configured to apply a pressure in a vertical direction, wherein the pressure member includes:

a first zone having a cylindrical shape; and a second zone having a ring shape surrounding the first zone, wherein the substrate includes:

a first substrate zone configured to receive a pressure in the vertical direction from the first zone; and a second substrate zone configured to receive a pressure in the vertical direction from the second zone, wherein the polishing of the substrate comprises:

rotating the polishing head and the polishing part;

changing pressures of the first zone and the second zone;

calculating polishing rates of the first substrate zone and the second substrate zone based on the changed pressures;

determining a reference polishing rate based on the polishing rates of the first substrate zone and the second substrate zone; and re-adjusting the changed pressure of the first zone based on the reference polishing rate.

* * * * *